(12) United States Patent
MacLaren et al.

(10) Patent No.: US 10,642,538 B1
(45) Date of Patent: May 5, 2020

(54) MULTI-CHANNEL MEMORY INTERFACE

(71) Applicant: Cadence Design Systems, Inc., San Jose, CA (US)

(72) Inventors: John M. MacLaren, Austin, TX (US); Jeffrey S. Earl, San Jose, CA (US); Anne Hughes, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 11 days.

(21) Appl. No.: 16/146,052

(22) Filed: Sep. 28, 2018

(51) Int. Cl.
| | |
|---|---|
| *G11C 7/10* | (2006.01) |
| *G06F 3/06* | (2006.01) |
| *G06F 13/16* | (2006.01) |
| *G06F 13/40* | (2006.01) |
| *G06F 30/30* | (2020.01) |
| *G11C 11/4096* | (2006.01) |
| *G11C 8/18* | (2006.01) |
| *G11C 7/22* | (2006.01) |

(52) U.S. Cl.
CPC .......... *G06F 3/0659* (2013.01); *G06F 3/0604* (2013.01); *G06F 3/0683* (2013.01); *G06F 13/1668* (2013.01); *G06F 13/4027* (2013.01); *G06F 30/30* (2020.01); *G11C 7/10* (2013.01); *G11C 7/1012* (2013.01); *G11C 7/1051* (2013.01); *G11C 7/1066* (2013.01); *G11C 7/1072* (2013.01); *G11C 7/1078* (2013.01); *G11C 11/4096* (2013.01); *G11C 7/22* (2013.01); *G11C 8/18* (2013.01)

(58) Field of Classification Search
CPC ...... G06F 3/0659; G06F 30/30; G06F 3/0604; G11C 7/22
See application file for complete search history.

(56) References Cited

U.S. PATENT DOCUMENTS

| | | | | |
|---|---|---|---|---|
| 7,872,892 B2* | 1/2011 | MacWilliams | ..... | G06F 12/0646 365/189.12 |
| 2004/0186956 A1* | 9/2004 | Perego | ............... | G06F 13/1684 711/115 |
| 2009/0037641 A1* | 2/2009 | Bresniker | ........... | G06F 13/1694 711/100 |
| 2012/0191921 A1* | 7/2012 | Shaeffer | .............. | G06F 13/1678 711/149 |
| 2019/0179791 A1* | 6/2019 | Shokrollahi | ........ | G11C 11/4093 |
| 2019/0339880 A1* | 11/2019 | Jiang | ...................... | G06F 13/28 |
| 2020/0019513 A1* | 1/2020 | Kozhikkottu | ....... | G06F 12/0623 |

* cited by examiner

*Primary Examiner* — Mushfique Siddique

(74) *Attorney, Agent, or Firm* — Schwegman Lundberg & Woessner, P.A.

(57) ABSTRACT

Various embodiments provide for a multi-channel memory interface capable of supporting a multi-channel memory module (e.g., DIMM) that combines different memory types, such as DDR4/DDR5, DDR5/LPDDR5, or LPDDR4/LPDDR5, through a single physical layer (PHY) interface.

17 Claims, 13 Drawing Sheets

MULTI-CHANNEL MEMORY INTERFACE

TECHNICAL FIELD

Embodiments described herein relate to memory and, more particularly, to multi-channel memory hardware interfaces.

BACKGROUND

Memory systems, such as those based on Double Data Rate (DDR) Dynamic Random-Access Memory (DRAM), generally include a memory controller, a memory physical layer (PHY), and memory coupled to the memory controller via the memory PHY. Examples of the memory types can include, without limitation, Double Data Rate 4 (DDR4), Double Data Rate 5 (DDR5), Low Power Double Data Rate 4 (LPDDR4), and Low Power Double Data Rate 5 (LPDDR5). Additionally, the memory may come in a variety of module configurations, such as a single-inline memory module (SIMM), a dual in-line memory module (DIMM), or registered DIMM (RDIMM).

To facilitate communication between the memory controller and the memory, the memory PHY may implement a memory interface protocol defined by an industry specification, such as a version of the DDR PHY Interface (DFI) specification (e.g., DFI 5.0). In general, for DDR4 DRAM, memory configured as a single-memory channel device that interfaces with a single memory controller through a single memory PHY hardware interface. For DDR5 DRAM, the memory is generally configured as a two-memory channel device, where the two channels can operate independently of one another.

Memory controller connectivity can be a challenge with respect to certain multi-channel memory modules, such as a memory module that combines DDR4/DDR5, DDR5/LPDDR5, or LPDDR4/LPDDR5. For instance, a DDR4/DDR5 RDIMM may comprise a single channel of 72-bit DDR4 memory on the RDIMM and two channels of 40-bit DDR5 memory on the RDIMM. For such an RDIMM, in order for the one channel of 72-bit DDR4 memory to operate, and the two channels of 40-bit DDR5 memory to operate independently (as intended), two separate memory controllers (MCs) of the same type (e.g., two 72-bit MCs that each support 72-bit DDR4 memory and 40-bit DDR5 memory) may be used in the design (e.g., circuit design) of a memory system in order to minimize or obviate the need for changes to the design of the memory PHY of the memory system.

Unfortunately, using two separate MCs of the same type can have a large power, performance, area (PPA) impact on the memory system's design.

BRIEF DESCRIPTION OF THE DRAWINGS

Various ones of the appended drawings merely illustrate example embodiments of the present disclosure and should not be considered as limiting its scope.

DETAILED DESCRIPTION

Various embodiments provide for a memory hardware interface (e.g., memory channel interface) capable of supporting multi-channel memory module (e.g., DIMM) that combines different memory types, such as DDR4/DDR5, DDR5/LPDDR5, or LPDDR4/LPDDR5, through a single physical layer (PHY) hardware interface. In particular, some embodiments provide for a memory hardware interface (also referred to herein as just "interface") that couples two or more memory controllers to a single memory PHY interface that couples to a multi-channel memory module. According to some embodiments, the memory interface manages various memory protocol signals (e.g., DFI protocol signals) that enables combination and interconnection of two or more memory controller channels to a single PHY interface.

Reference will now be made in detail to embodiments of the present disclosure, examples of which are illustrated in the appended drawings. The present disclosure may, however, be embodied in many different forms and should not be construed as being limited to the embodiments set forth herein.

Figure 1:
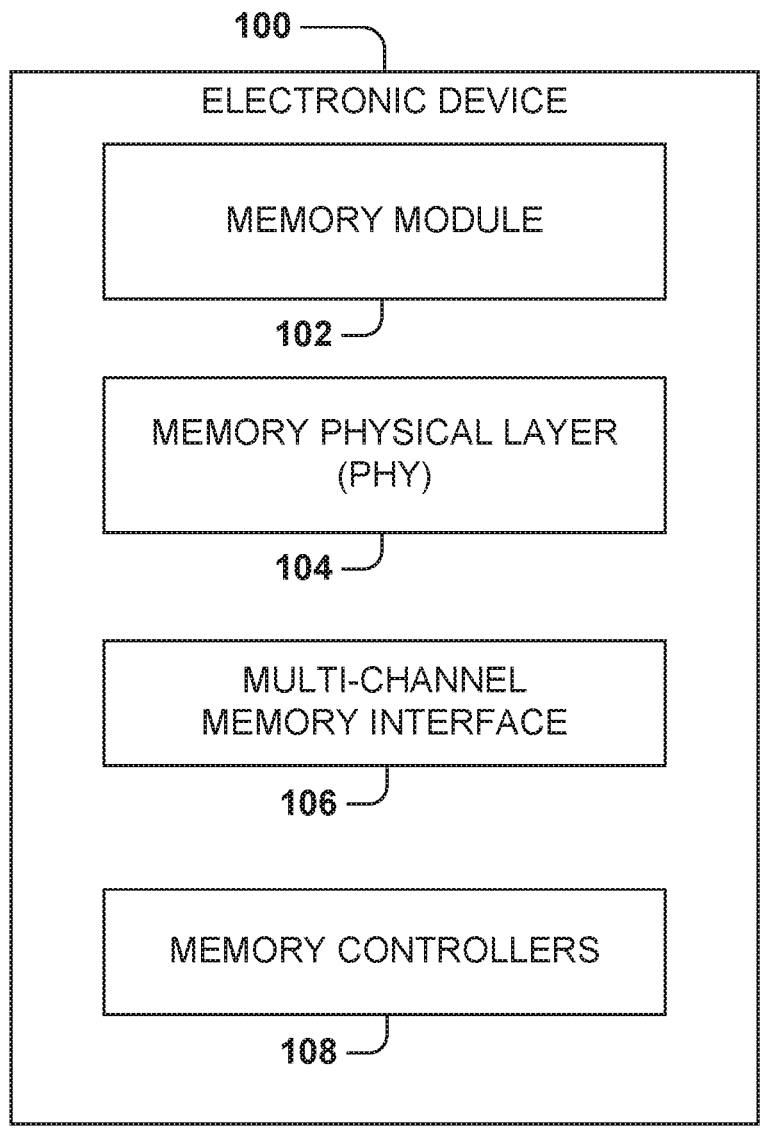
FIG. 1 is a block diagram illustrating an example electronic device that comprises an example multi-channel memory interface, in accordance with various embodiments.

FIG. 1 is a block diagram illustrating an example electronic device 100 that comprises an example multi-channel memory interface 106, in accordance with various embodiments. The electronic device 100 may comprise any electronic device that uses a memory and a processor, such as a central processor unit (CPU) or a graphics processing unit (GPU). For instance, the electronic device 100 may comprise, without limitation, a computer (e.g., a server computer, a client computer, a personal computer (PC), a tablet computer, a laptop computer, a netbook), a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any electronic device capable of executing instructions with respect to a memory.

As shown, the electronic device 100 includes a memory module 102, a memory physical layer (PHY) 104, the multi-channel memory interface 106, and a plurality of memory controllers 108. Any one or more of the modules described may be implemented using hardware alone or a combination of hardware and software. Moreover, any two or more modules of the electronic device 100 may be combined into a single module, and the functions described herein for a single module may be subdivided among multiple modules. Though various embodiment are described herein with respect to two memory controllers coupled to a multi-channel interface (e.g., 106), some embodiments comprise a multi-channel interface that couples three or more memory controllers to a memory PHY.

To avoid obscuring illustrated embodiments with unnecessary detail, various functional components (e.g., modules) that are not germane to conveying an understanding of the illustrated embodiments have been omitted from FIG. 1.

Various additional functional components may be supported by the electronic device 100 to facilitate additional functionality that is not specifically described herein.

The memory module 102 comprises one or more memory cells or memory devices, each of which may comprise some form of random access memory (RAM), such as Dynamic Random-Access Memory (DRAM) or Static Random-Access Memory (SRAM). The memory module 102 may be packaged as a single in-line memory module (SIMM), a dual in-line memory module (DIMM), or a registered dual in-line memory module (RDIMM), that can be plugged into an electronic device including an appropriate socket. For some embodiments, the memory module 102 comprises Double Data Rate (DDR) Dynamic Random-Access Memory (DRAM), such as Double Data Rate 4 (DDR4), Double Data Rate 5 (DDR5), Low Power Double Data Rate 4 (LPDDR4), and Low Power Double Data Rate 5 (LPDDR5). For some embodiments, the memory module 102 comprises a multi-channel memory module that combines memory types of different data width (e.g., 32-bit, 40-bit, 64-bit, 72-bit). For instance, the memory module 102 comprises a RDIMM that combines single-channel 72-bit DDR4 memory and two-channel (dual-channel) 40-bit DDR5 memory.

The memory PHY 104 comprises one or more electronic signal paths (e.g., individual lines between pins of the memory module 102 and the multi-channel memory interface 106) coupling together the memory module 102 and the multi-channel memory interface 106 such that data, address, command, protocol, control, clock, and other information can be carried between the memory module 102 and the multi-channel memory interface 106. For example, the memory PHY 104 may comprise an interconnect, such as a link or a bus. Accordingly, the memory PHY 104 may carry one or more electronic signals between the memory module 102 and the multi-channel memory interface 106. Among the electronic signals carried, the memory PHY 104 may carry one or more data signals for data to be written to, or read from, the memory module 102 (e.g., a memory cell of the memory module 102). Additionally, the memory PHY 104 may carry one or more signals, which can facilitate writing data to, or reading data from, the memory module 102 (e.g., a memory cell of the memory module 102). Such signals can include, without limitation, memory protocol signals (e.g., protocol signals defined by a DFI specification) and memory control signals. The memory PHY 104 may further comprise a memory socket, such as a SIMM or DIMM socket, configured to connect to a particular memory module package.

Each of the memory controllers 108 manages exchange of data to and from the memory module 102, via the multi-channel memory interface 106 and the memory PHY 104. To facilitate this, the memory controllers 108 may exchange data, address, command, protocol, control, clock, and other information with the memory module 102 over the multi-channel memory interface 106 and the memory PHY 104. For some embodiments, the memory controllers 108 include a first memory controller that supports a first memory type channel and a second memory type channel of the memory module 102, and a second memory controller that supports another first memory type channel of the memory module 102. For instance, the memory module 102 comprises a DDR4/DDR5 RDIMM, the memory controllers 108 include a 72-bit memory controller that supports a single 72-bit DD4 memory channel of the DDR4/DDR5 RDIMM and that supports a 40-bit DDR5 memory channel of the DDR4/DDR5 RDIMM, and a 40-bit memory controller that supports another 40-bit DDR5 memory channel of the DDR4/DDR5 RDIMM.

The multi-channel memory interface 106 couples each of the plurality of the memory controllers 108 to the memory PHY 104. According to various embodiments, the multi-channel memory interface 106 multiplexes one or more data signals from the memory module 102, through the memory PHY 104, to at least one of the plurality of memory controllers 108. The one or more data signals being multiplexed to the memory module 102 may carry data being read from the memory module 102. Additionally, according to various embodiments, the multi-channel memory interface 106 demultiplexes one or more data signals from at least one of the plurality of memory controllers 108 to the memory module 102, through the memory PHY 104. The one or more data signals being demultiplexed to the memory module 102 may carry data to be written to the memory module 102.

Depending on the embodiment, each of the plurality of memory controllers 108 may comprise specific logic to handle certain memory protocol signals received from the memory PHY 104 (e.g., PHY master request in connection with an oscillator-related function) and facilitate proper operation between the plurality of memory controllers 108 and the memory module 102 through the memory PHY 104.

The multi-channel memory interface 106 handles (e.g., selectively passes or logically combines) one or more memory protocol signals (e.g., defined by a DFI specification) passed between the plurality of memory controllers 108 and the memory PHY 104. In doing so, the multi-channel memory interface 106 can permit the plurality of memory controllers 108 to operate the memory module 102, comprising a multi-channel memory module combining memory types of different data width, through a single memory PHY 104. In particular, the multi-channel memory interface 106 can receive a first set of memory protocol signals from a first memory controller of the memory controllers 108, receive a second set of memory protocol signals from a second memory controller of the memory controllers 108, and generate a third set of memory protocol signals based on the first set of memory protocol signals and the second set of memory protocol signals (e.g., logically combine memory protocol signals). The multi-channel memory interface 106 can transmit the third set of memory protocol signals to the memory PHY 104, and on to the memory module 102. Additionally, the multi-channel memory interface 106 can receive a fourth set of memory protocol signals from the memory PHY 104, and selectively pass the fourth set of memory protocol signals to at least one of the plurality of memory controllers 108.

More regarding some embodiments of the multi-channel memory interface 106 are described below with respect to FIG. 2.

Figure 2:
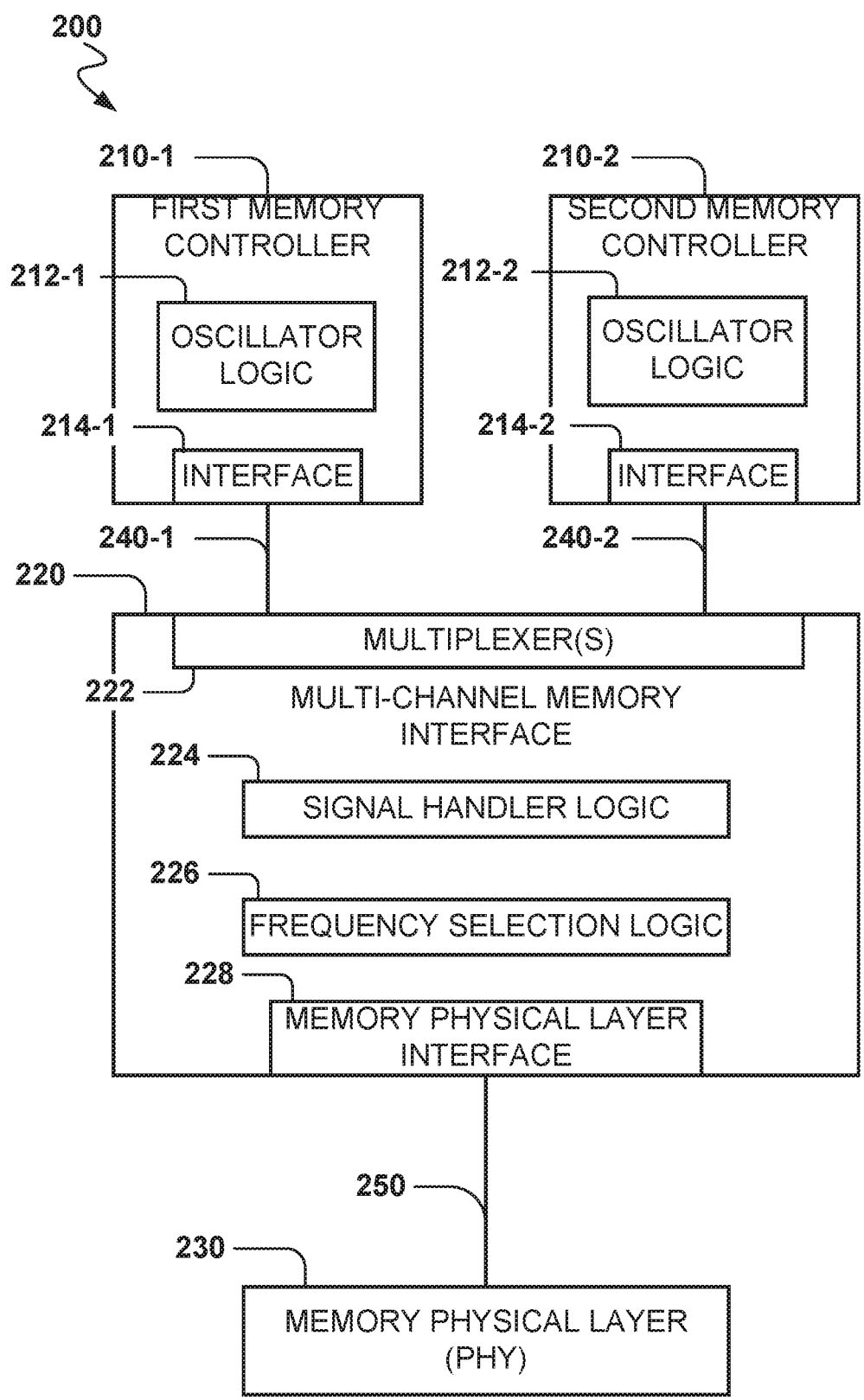
FIG. 2 is a block diagram illustrating an example memory system comprising an example multi-channel memory interface, in accordance with various embodiments.

FIG. 2 is a block diagram illustrating an example memory system 200 comprising an example multi-channel memory interface, in accordance with various embodiments. To avoid obscuring illustrated embodiments with unnecessary detail, various functional components (e.g., modules) that are not germane to conveying an understanding of the illustrated embodiments have been omitted from FIG. 2.

As shown, the memory system 200 includes a first memory controller (MC) 210-1, a second memory controller (MC) 210-2, a multi-channel memory interface 220, and a memory physical layer (PHY) 230. The first MC 210-1 is coupled to the multi-channel memory interface 220 by a first data bus 240-1, the second MC 210-2 is coupled to the multi-channel memory interface 220 by a second data bus 240-2, and the multi-channel memory interface 220 is coupled to the memory PHY 230 by a third data bus 250. One or more of the data buses 240-1, 240-2, 250 may carry signals (e.g., data signals and memory protocol signals) in accordance with an industry specification, such as a DFI specification. For some embodiments, the first data bus 240-1 has a data width equal to the maximum data width (e.g., 72-bits) supported by the first MC 210-1, the second data bus 240-2 has a data width equal to the maximum data width (e.g., 40-bits) supported by the second MC 210-2, and the third data bus 250 has a data width equal to the data width (e.g., 80-bits) of the memory PHY 230. The first memory controller 210-1 comprises an interface 214-1 (e.g., DFI-based interface) to couple the first memory controller 210-1 to the first data bus 240-1, and the second memory controller 210-2 comprises an interface 214-2 (e.g., DFI-based interface) to couple the second memory controller 210-2 to the second data bus 240-2.

The multi-channel memory interface 220 comprises one or more multiplexers 222, signal handler logic 224, frequency selection logic 226, and a memory physical layer (PHY) interface 228 that couples the multi-channel memory interface 220 to the memory PHY 230 via the data bus 250. For some embodiments, the memory PHY interface 228 comprises a DFI-based interface with flops, and each interface 214-1, 214-2 comprise a DFI-based interface without flops. In this way, for some embodiments, the multi-channel memory interface 220 can handle signals (e.g., combine data signals and memory protocol signals) communicated between the memory controllers 210-1, 210-2 and the memory PHY 230 such that the memory PHY 230 is only made aware of a single DFI-based interface and the memory PHY 230 operates as if it is interacting with a single memory controller rather than a plurality of memory controllers (210-1 and 210-2).

The multiplexers 222 enable the multi-channel memory interface 220 to multiplex one or more data signals from the memory PHY 230 (through the memory PHY interface 228) to at least one of the memory controllers 210-1, 210-2, and to demultiplex one or more data signals from at least one of the memory controllers 210-1, 210-2 to the memory PHY 230 (through the memory PHY interface 228). Though not illustrated, the multiplexers 222 may include a first memory controller interface to couple the multi-channel memory interface 220 to the first memory controller 210-1, and a second memory controller interface to couple the multi-channel memory interface 220 to the second memory controller 210-2. The signal handler logic 224 enables the multi-channel memory interface 220 to receive and, if necessary, process (e.g., combine) memory protocol signals (e.g., DFI-defined signals) that pass through the multi-channel memory interface 220, between the memory controllers 210-1, 210-2 and the memory PHY 230.

The signal handler logic 224 enables the multi-channel memory interface 220 to handle (e.g., combine) one or more memory protocol signals communicated between the memory controllers 210-1, 210-2 and the memory PHY 230. The signal handler logic 224 can cause the multi-channel memory interface 220 to generate a set of memory protocol signals based on (e.g., by logically combining) a first set of memory protocol signals received from the first memory controller 210-1 and a second set of memory protocol signals received from the first memory controller 210-2. The generated set of memory protocol signals can then be passed on to the memory PHY 230 via the memory PHY interface 228. Similarly, the signal handler logic 224 can cause the multi-channel memory interface 220 to receive a set of memory protocol signals from the memory PHY 230 (via the memory PHY interface 228) and selectively pass the set of memory protocol signals to at least one of the first memory controller 210-1 or the second memory controller 210-2.

For example, the signal handler logic 224 can enable the multi-channel memory interface 220 to receive a reset signal (e.g., DFI reset signal, dfi_reset_n) from each of the first and second memory controllers 210-1, 210-2 and to either logically OR the two reset signals together or mux the two reset signals based on one of the first and second memory controllers 210-1, 210-2 being defined as a reset master. The output of the logical OR operation or the mux is then provided to the memory PHY 230.

As another example, the signal handler logic 224 can enable the multi-channel memory interface 220 to receive a clock disable signal (e.g., DFI clock disable signal, dfi_dram_clk_disable) from each of the first and second memory controllers 210-1, 210-2, combine the signals, provide the combined signal to the memory PHY 230, and to coordinate power reduction on the memory module clock.

As another example, the signal handler logic 224 can enable each of the first and second memory controllers 210-1, 210-2 to have an independent programming path to the memory PHY 230 through the multi-channel memory interface 220. One of first and second memory controllers 210-1, 210-2 can be designated a master for programming the memory PHY 230. The master controller designation can change if, for example, the current memory controller acting as master is disabled.

As another example, the signal handler logic 224 can enable the multi-channel memory interface 220 to selectively pass a bus error signal (e.g., DFI error signal, dfi_error) from the memory PHY 230 to both the first and second memory controllers 210-1, 210-2. The bus error signal may reflect a parity/CRC error.

As another example, the signal handler logic 224 can enable the multi-channel memory interface 220 to coordinate memory initialization/startup and frequency changes between the first and second memory controllers 210-1, 210-2 and the memory PHY 230. The signal handler logic 224 can enable the multi-channel memory interface 220 to receive an initialization start signal (e.g., DFI initialization start signal, dfi_init_start) from each of the first and second memory controllers 210-1, 210-2 and to pass (e.g., assert) a single initialization start signal to the memory PHY 230 only when both the first and second memory controllers 210-1, 210-2 independently assert the frequency change initialization start signal (e.g., when both memory controllers 210-1, 210-2 are ready).

Upon receiving the initialization start signal from the multi-channel memory interface 220, the memory PHY 230 can perform memory initialization and, when completed, can assert an initialization complete signal (e.g., DFI initialization complete signal, dfi_init_complete) back to the multi-channel memory interface 220. The signal handler logic 224 can enable the multi-channel memory interface 220 to receive the initialization complete signal and pass the initialization complete signal to each of the first and second memory controllers 210-1, 210-2. Following the initialization complete signal being passed to each of the first and second memory controllers 210-1, 210-2, one or more of the first and second memory controllers 210-1, 210-2 can continue with additional memory programming (e.g., by the memory controller acting as the master). Once the initialization is completed, the first and second memory controllers 210-1, 210-2 can operate independently.

To facilitate frequency change, the multi-channel memory interface 220 can share a hardware interface with the first and second memory controllers 210-1, 210-2 for initiating data frequency selection (DFS) events. The frequency selection logic 226 can enable the multi-channel memory interface 220 to assert the hardware interface request to the memory PHY 230 in response to both the first and second memory controllers 210-1, 210-2 asserting a request to initialize a data frequency selection event. The frequency selection logic 226 can enable the multi-channel memory interface 220 to detect for requests to initialize a data frequency selection event from each of the first and the second memory controllers 210-1, 210-2. Each of the first and the second memory controllers 210-1, 210-2 initiates the requests to the memory PHY 230 when they are individually ready to do so. There can be a large delta between requests from each of the first and the second memory controllers 210-1, 210-2, which can result in one of the first and second memory controllers 210-1, 210-2 sitting idle while the other memory controller sequences through commands to send the request. Upon receiving requests from both the first and second memory controllers 210-1, 210-2, the frequency selection logic 226 can cause the multi-channel memory interface 220 to send (e.g., issue) a data frequency selection (DFS) command to the memory PHY 230.

In response to the DFS command, each of the first and second memory controllers 210-1, 210-2 may assert an initialization start signal (e.g., dfi_init_start), which may be handled by the multi-channel memory interface 220 as described herein. Upon the memory PHY 230 receiving the initialization start signal from the multi-channel memory interface 220, the memory PHY 230 can deassert an initialization complete signal (e.g., dfi_init_complete) back to the multi-channel memory interface 220, which the multi-channel memory interface 220 can pass on to the first and second memory controllers 210-1, 210-2. The first and second memory controllers 210-1, 210-2 can then drive a clock module interface to request a clock frequency change. The first and second memory controllers 210-1, 210-2 can deassert the initialization start signal (e.g., dfi_init_start) when the clock is at a new frequency, and the memory PHY 230 can assert an initialization complete signal (e.g., dfi_init_complete) back to the multi-channel memory interface 220 when the memory PHY 230 is ready.

With respect to training of the memory PHY 230, the signal handler logic 224 can enable the multi-channel memory interface 220 to receive a physical layer request (e.g., DFI PHY master request, dfi_phymstr_req) and pass the physical layer request to each of the first and second memory controllers 210-1, 210-2. The signal handler logic 224 can further enable the multi-channel memory interface 220 to receive a request acknowledgement (e.g., DFI PHY master acknowledgment, dfi_phymstr_ack) from each of the first and second memory controllers 210-1, 210-2 and, upon receiving acknowledgements from both of the first and second memory controllers 210-1, 210-2, pass a single request acknowledgement to the memory PHY 230.

With respect to updating the memory PHY 230, the signal handler logic 224 can enable the multi-channel memory interface 220 to receive an update acknowledgement (e.g., DFI PHY update acknowledgment, dfi_phyupd_ack) from each of the first and second memory controllers 210-1, 210-2 and, upon receiving acknowledgements from both of the first and second memory controllers 210-1, 210-2, pass a single update acknowledgement to the memory PHY 230.

Each of the first and second memory controllers 210-1, 210-2 comprises oscillator logic 212-1, 212-2. The oscillator logic 212-1, 212-2 can enable its respective memory controller to handle certain memory protocol signals received from the memory PHY 230 and facilitate proper operation between the first and second memory controllers 210-1, 210-2 and a memory module coupled to the memory PHY 230. According to various embodiments, each of the first and second memory controllers 210-1, 210-2 can generate oscillator commands (e.g., DQS oscillator commands) independently through the multi-channel memory interface 220. The signal handler logic 224 can enable the multi-channel memory interface 220 to combine physical layer (PHY) info buses from the first and second memory controllers 210-1, 210-2. For example, when one of the first and second memory controllers 210-1, 210-2 sends (e.g., issues) a physical layer (PHY) info request to the multi-channel memory interface 220, the signal handler logic 224 can enable the multi-channel memory interface 220 to pass the PHY info request on to the memory PHY 230. In response, the memory PHY 230 can send a PHY acknowledgement back to the multi-channel memory interface 220, and the signal handler logic 224 can enable the multi-channel memory interface 220 to pass on the PHY acknowledgement back to at least the requesting memory controller. The memory PHY 230 can then proceed by making a PHY master request (e.g., dfi_phymstr_req), which permits the memory PHY 230 to perform write training (e.g., write DQ training) after each of the first and second memory controllers 210-1, 210-2 has acknowledged the PHY master request. To prevent the memory PHY 230 from running training (e.g., write DQ training) on stale data with respect to one of the first and second memory controllers 210-1, 210-2 that may be currently running a oscillator function (e.g., DQS oscillator function), the oscillator logic 212-1, 212-2 can enable its respective memory controller to hold-off on responding to a request from the memory PHY 230 (e.g., DFI PHY master request, dfi_phymstr_req) with an acknowledgment. If one of the first and second memory controllers 210-1, 210-2 is in the process of performing an oscillator function (e.g., oscillator read function), that memory controller could hold off the acknowledgment of the request until the function has completed. In doing so, back-to-back training requests could be prevented.

Accordingly, the oscillator logic 212-1, 212-2 can enable its respective memory controller to detect receipt of a request (e.g., PHY master request) from the memory PHY 230, and, in response, determine whether an oscillator-related function is in progress with respect to a memory channel associated with the memory physical layer. In response to determining that the oscillator-related function is in progress, the oscillator logic 212-1, 212-2 can enable its respective memory controller to detect when the oscillator-related function is no longer in progress and, in response to detecting that the oscillator-related function is no longer in progress, send an acknowledgment to the request (e.g., PHY master request) to the memory PHY 230.

The memory PHY 230 comprises one or more electronic signal paths (e.g., individual lines between pins of the memory module coupled to the memory PHY 230) coupling together a memory module (e.g., DDR4/DDR5 RDIMM) to the third data bus 250. As noted herein, the electronic signal paths of the memory PHY 230 can carry data, address, command, protocol, control, clock, and other information to and from a memory module coupled to the memory PHY 230. Accordingly, the memory PHY 230 may carry one or more electronic signals between a memory module and the multi-channel memory interface 220. The memory PHY 230 may further comprise a memory socket, such as a SIMM or DIMM socket, configured to connect to a particular memory module package. Among the electronic signals carried, the memory PHY 230 may carry one or more data signals for data to be written to, or read from, a memory module (e.g., a memory cell of the memory module). Additionally, the memory PHY 230 may carry one or more signals, which can facilitate writing data to, or reading data from, a memory module a (e.g., a memory cell of the memory module). Such signals can include, without limitation, memory protocol signals (e.g., protocol signals defined by a DFI specification) and memory control signals.

For circuit design purposes, the first and second memory controllers 210-1, 210-2 and the multi-channel memory interface 220 may be placed within a circuit design wrapper, which can then be added to a circuit design.

Figure 3:
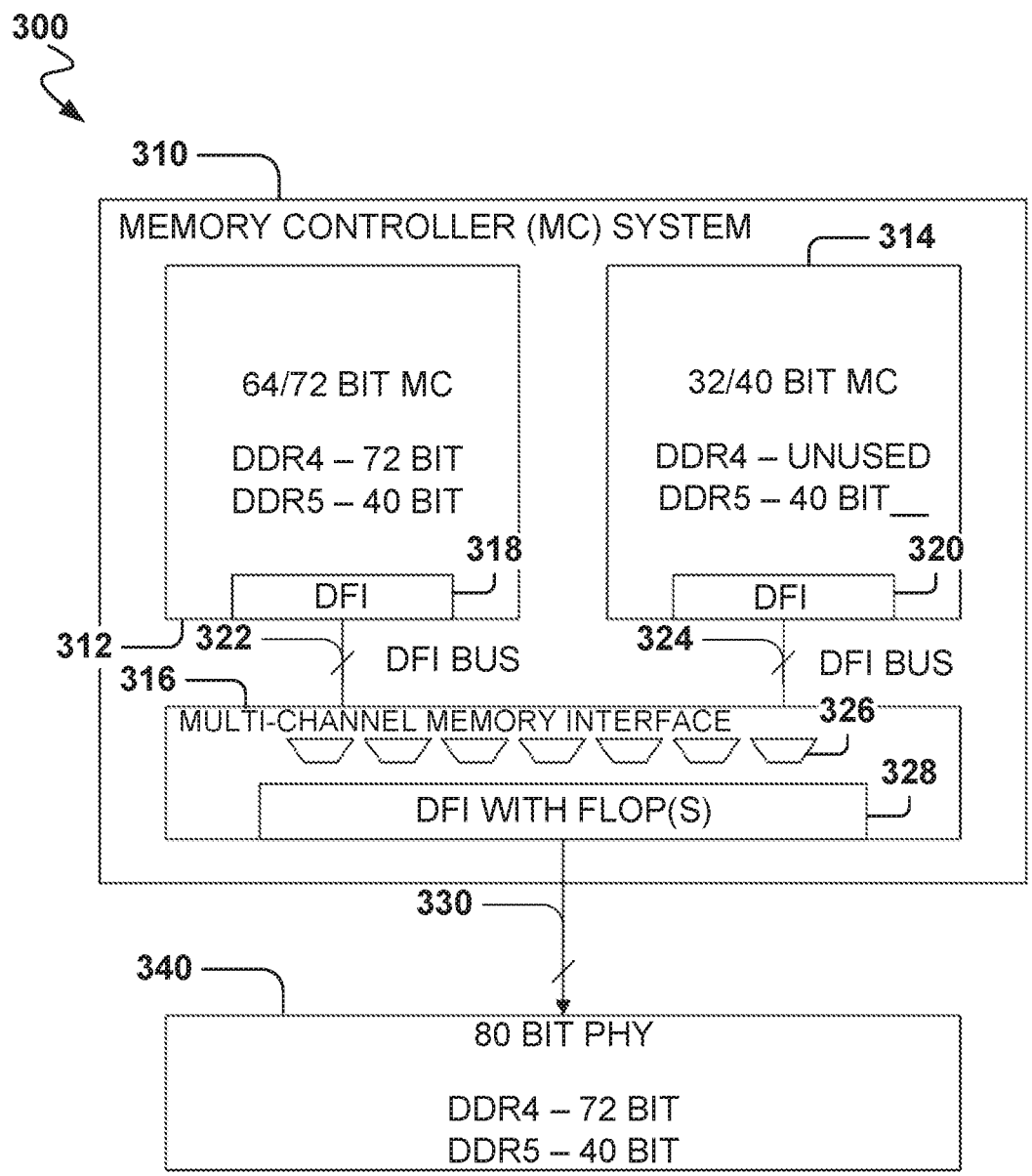
FIG. 3 is a block diagram illustrating an example memory system comprising an example multi-channel memory interface, in accordance with various embodiments.

FIG. 3 is a block diagram illustrating an example memory system 300 comprising an example multi-channel memory interface, in accordance with various embodiments. To avoid obscuring illustrated embodiments with unnecessary detail, various functional components (e.g., modules) that are not germane to conveying an understanding of the illustrated embodiments have been omitted from FIG. 3.

As shown, the memory system 300 includes a memory controller (MC) system 310, an 80-bit memory physical layer (PHY) 340 that supports a single channel of 72-bit DDR4 memory and two channels of 40-bit DDR5 memory, and a DFI-based bus 330 coupling the MC system 310 to the memory PHY 340. The MC system 310 comprises a 64/72-bit (72-bit with ECC) memory controller (MC) 312 that supports one channel of 72-bit DDR4 memory and one channel of 40-bit DDR5 memory, a 32/40-bit (40-bit with ECC) memory controller (MC) 314 that supports at least one channel of 40-bit DDR5 memory, and a multi-channel memory interface 316 that couples to the MCs 312, 314 via DFI-based buses 322, 324, respectively. Each of the MCs 312, 314 includes a DFI-based interface 318, 320. According to various embodiments, the multi-channel memory interface 316 comprises logic for multiplexing 326 data signals and memory protocol signal handling (e.g., DFI memory protocol signals). The multi-channel memory interface 316 includes a DFI-based interface 328 with flops to couple the multi-channel memory interface 316 to the memory PHY 340.

Figure 4:
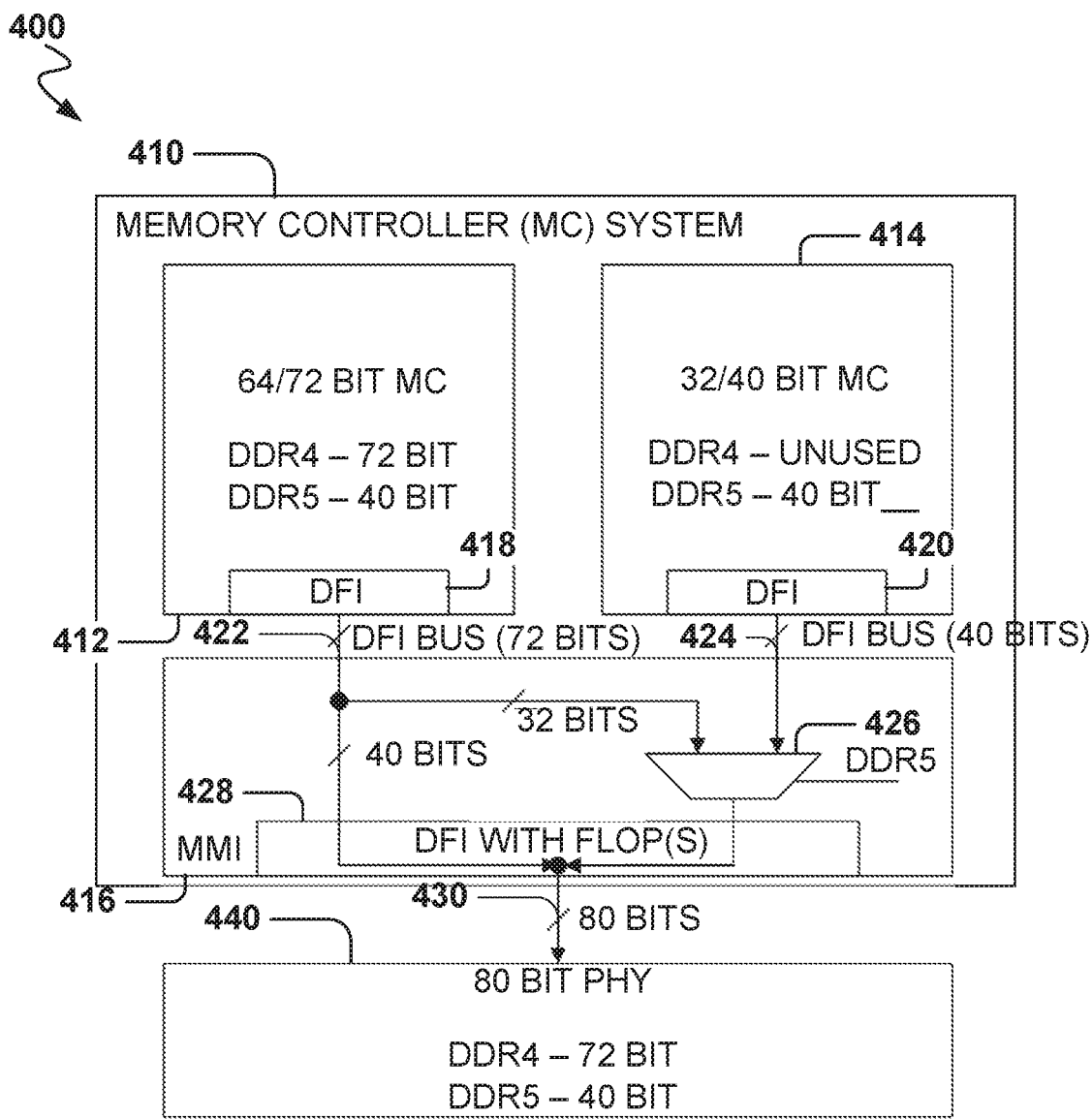
FIG. 4 is a block diagram illustrating an example write data path in an example memory system comprising an example multi-channel memory interface, in accordance with various embodiments.

FIG. 4 is a block diagram illustrating an example write data path in an example memory system 400 comprising an example multi-channel memory interface 416, in accordance with various embodiments. To avoid obscuring illustrated embodiments with unnecessary detail, various functional components (e.g., modules) that are not germane to conveying an understanding of the illustrated embodiments have been omitted from FIG. 4.

As shown, the memory system 400 includes a memory controller (MC) system 410, an 80-bit memory physical layer (PHY) 440 that supports a single channel of 72-bit DDR4 memory and two channels of 40-bit DDR5 memory, and a DFI-based bus 430 coupling the MC system 410 to the memory PHY 440. The MC system 410 comprises a 64/72-bit (72-bit with ECC) memory controller (MC) 412 that supports one channel of 72-bit DDR4 memory and one channel of 40-bit DDR5 memory, a 32/40-bit (40-bit with ECC) memory controller (MC) 414 that supports at least one channel of 40-bit DDR5 memory, and a multi-channel memory interface (MMI) 416 that couples to the MCs 412, 414 via DFI-based buses 422, 424, respectively. Each of the MCs 412, 414 includes a DFI-based interface 418, 420. The multi-channel memory interface 416 includes a DFI-based interface 428 with flops to couple the multi-channel memory interface 416 to the memory PHY 440.

In DDR4 mode, only the MC 412 would be operational, and the multiplexer 426 within the multi-channel memory interface 416 would be set such that the write data path (72-bits data path) to the memory PHY 440 comes from the MC 412. In DDR5 mode, both the MC 412 and 414 would be operational, and the multiplexer 426 would be set such that 40-bits of 80-bit write data path to the memory PHY 440 come from each of the MCs 412, 414.

Figure 5:
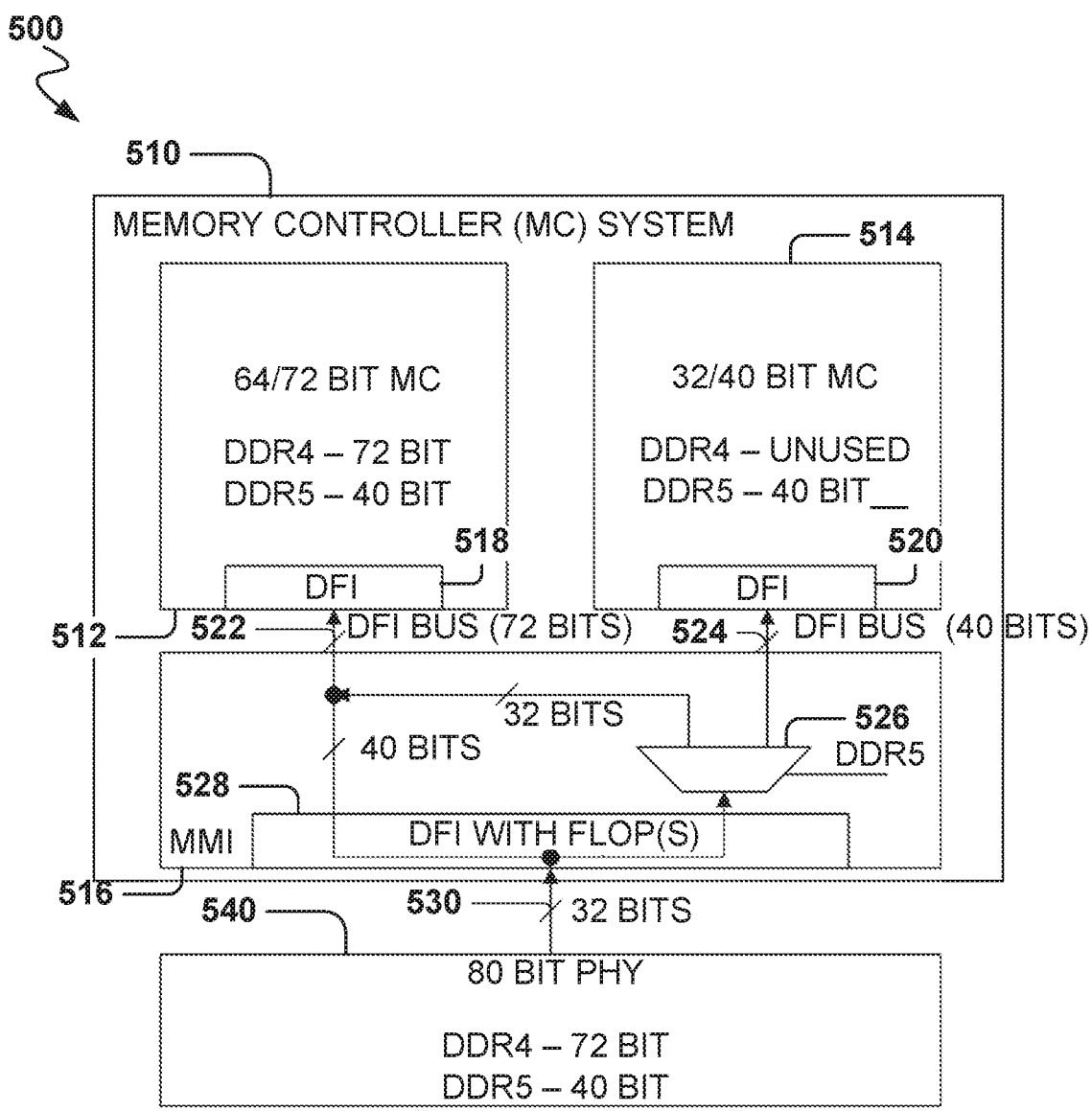
FIG. 5 is a block diagram illustrating an example read data path in an example memory system comprising an example multi-channel memory interface, in accordance with various embodiments.

FIG. 5 is a block diagram illustrating an example read data path in an example memory system 500 comprising an example multi-channel memory interface 516, in accordance with various embodiments. To avoid obscuring illustrated embodiments with unnecessary detail, various functional components (e.g., modules) that are not germane to conveying an understanding of the illustrated embodiments have been omitted from FIG. 5.

As shown, the memory system 500 includes a memory controller (MC) system 510, an 80-bit memory physical layer (PHY) 540 that supports a single channel of 72-bit DDR4 memory and two channels of 40-bit DDR5 memory, and a DFI-based bus 530 coupling the MC system 510 to the memory PHY 540. The MC system 510 comprises a 64/72-bit (72-bit with ECC) memory controller (MC) 512 that supports one channel of 72-bit DDR4 memory and one channel of 40-bit DDR5 memory, a 72/40-bit (40-bit with ECC) memory controller (MC) 514 that supports at least one channel of 40-bit DDR5 memory, and a multi-channel memory interface (MMI) 516 that couples to the MCs 512, 514 via DFI-based buses 522, 524, respectively. Each of the MCs 512, 514 includes a DFI-based interface 518, 520. The multi-channel memory interface 516 includes a DFI-based interface 528 with flops to couple the multi-channel memory interface 516 to the memory PHY 540.

In DDR4 mode, only the MC 512 would be operational, and the multiplexer 526 within the multi-channel memory interface 516 would be set such that the read data path (72-bits data path) from the memory PHY 540 is directed to the MC 512. In DDR5 mode, both the MC 512 and 514 would be operational, and the multiplexer 526 would be set such that 40-bits of the 80-bit read data path are directed to each of the MCs 512, 514.

Figure 6:
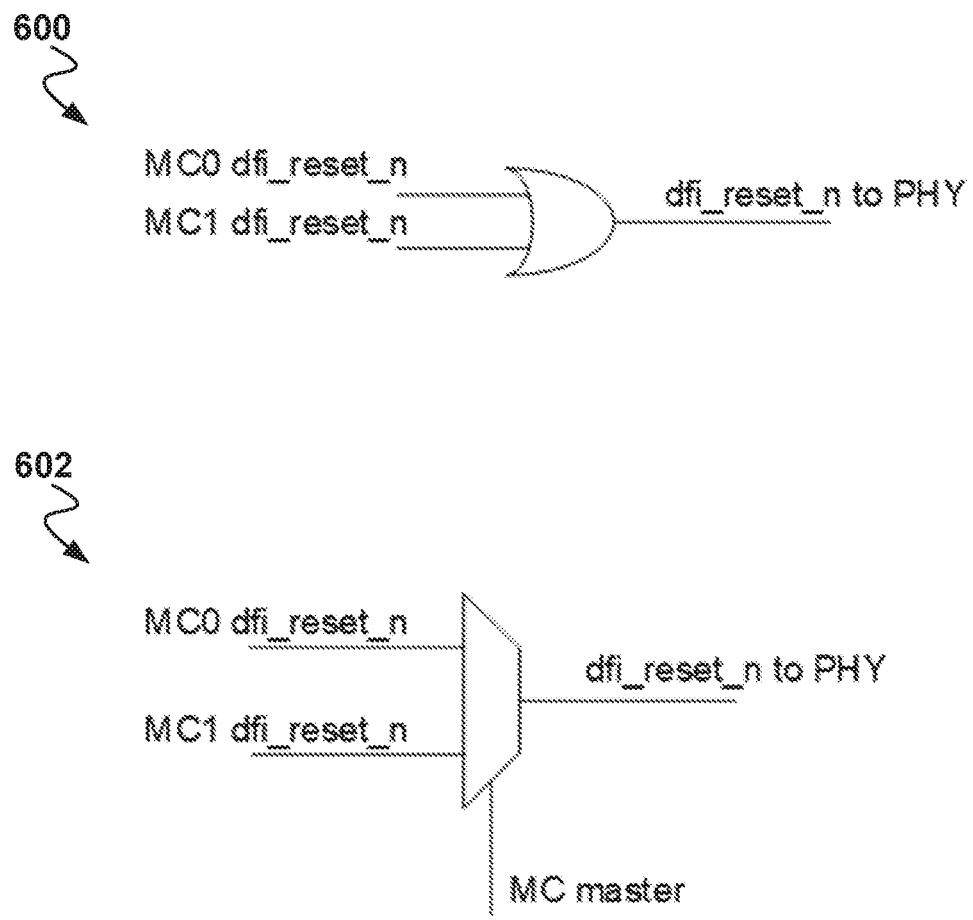
FIGS. 6 through 9 are logic diagrams illustrating how an example multi-channel memory interface handles memory protocol signals, in accordance with various embodiments.

FIGS. 6 through 9 are logic diagrams illustrating how an example multi-channel memory interface handles memory protocol signals, in accordance with various embodiments. In FIG. 6, logic diagram 600 illustrates logically ORing of dfi_reset_n signals received at a multi-channel memory interface, from two memory controls MC0 and MC1, to generate a single dfi_reset_n signal to be sent to a memory PHY. As an alternative approach to handling dfi_reset_n signals, logic diagram 602 illustrates multiplexing (based on which MC is designated as master) the dfi_reset_n signals received at the multi-channel memory interface to generate a single dfi_reset_n signal to be sent to the memory PHY.

Figure 7:
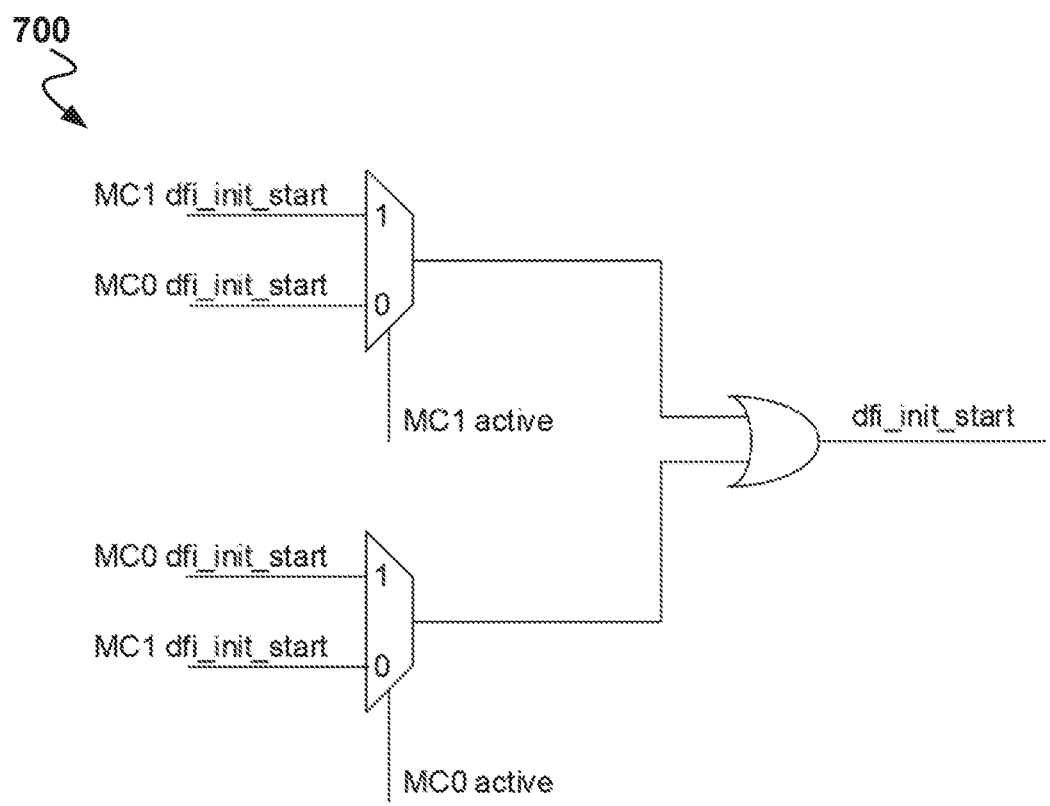

In FIG. 7, logic diagram 700 illustrates handling of dfi_init_start signals received from each of MC0 and MC1 such that the multi-channel memory interface only has to account for one of the MCs being active to generate the dfi_init_start signal to the memory PHY. As noted herein, a multi-channel memory interface of an embodiment may not assert the dfi_init_start signal to the memory PHY until both MC0 and MC1 assert the dfi_init_start signal.

Figure 8:
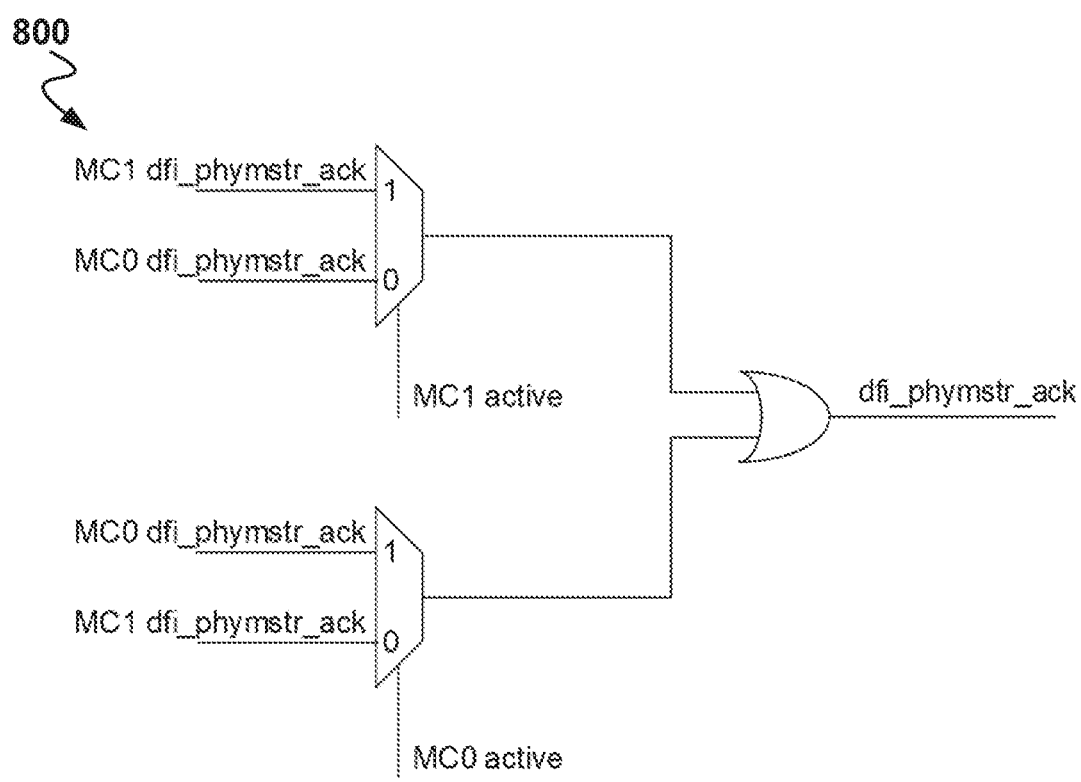

In FIG. 8, logic diagram 800 illustrates handling of dfi_phymstr_ack signals received from each of MC0 and MC1 such that the multi-channel memory interface only has to account for one of the MCs being active to generate the dfi_phymstr_ack signal to the memory PHY. As noted herein, a multi-channel memory interface of an embodiment may not assert the dfi_phymstr_ack signal to the memory PHY until both MC0 and MC1 assert the dfi_phymstr_ack signal to the multi-channel memory interface.

Figure 9:
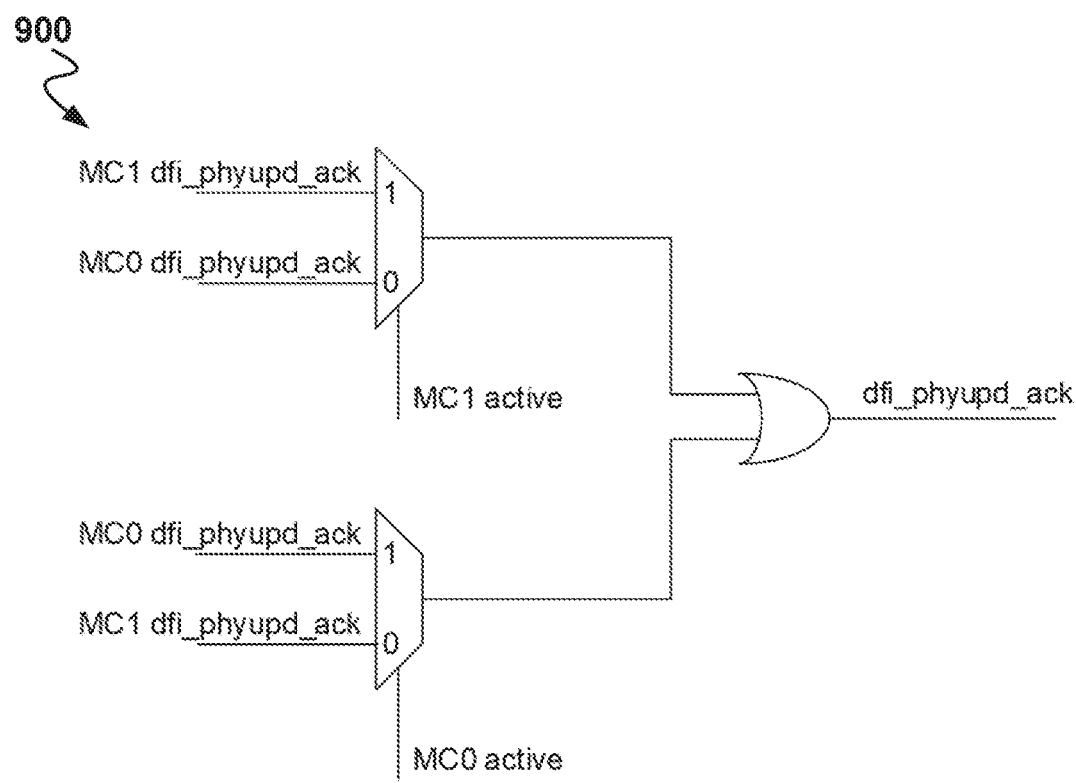

In FIG. 9, logic diagram 900 illustrates handling of dfi_phyupd_ack signals received from each of MC0 and MC1 such that the multi-channel memory interface only has to account for one of the MCs being active to generate the dfi_phyupd_ack signal to the memory PHY. As noted herein, a multi-channel memory interface of an embodiment may not assert the dfi_phyupd_ack signal to the memory PHY until both MC0 and MC1 assert the dfi_phyupd_ack signal to the multi-channel memory interface.

Figure 10:
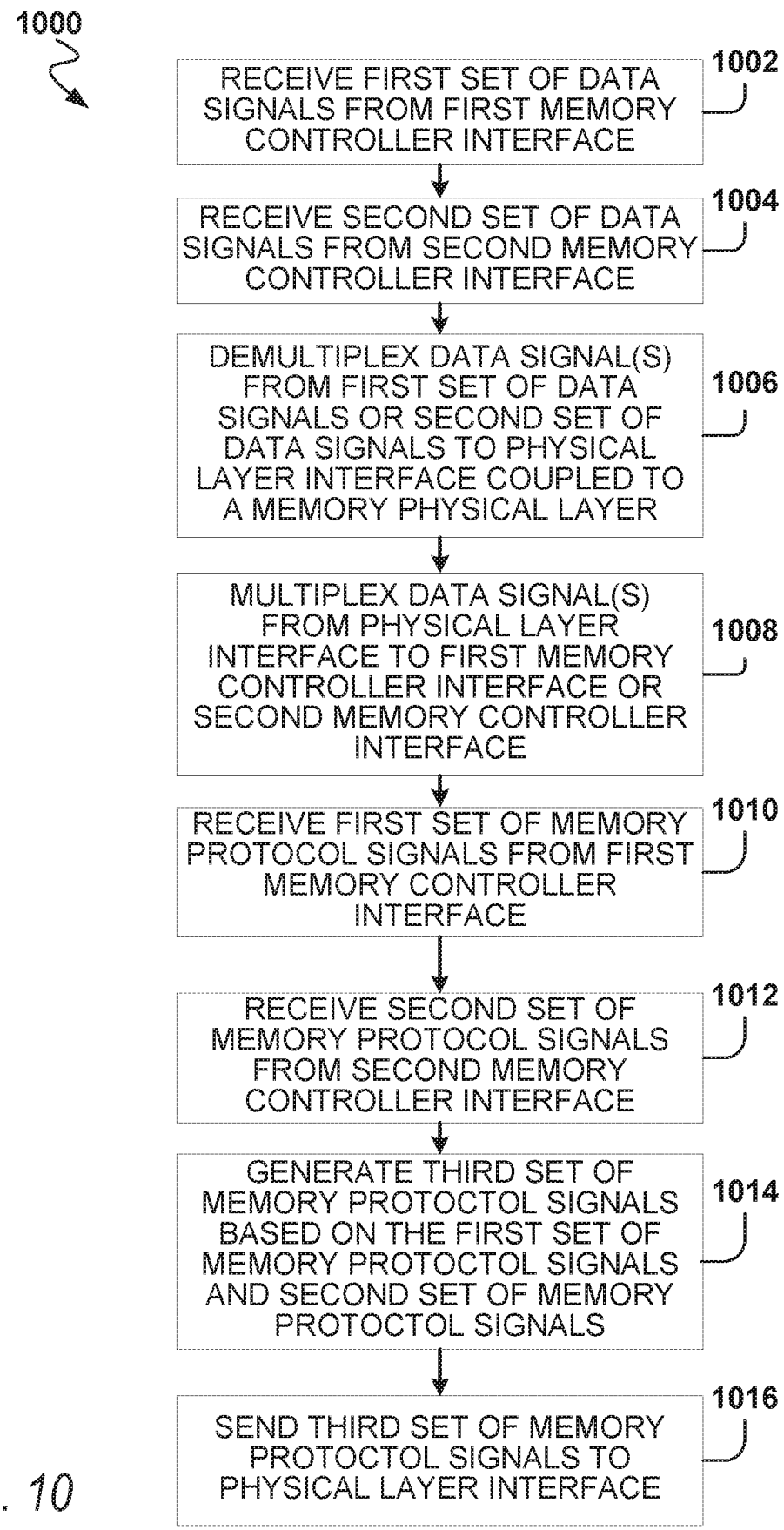
FIG. 10 is a flowchart illustrating an example method for an example multi-channel memory interface, in accordance with various embodiments.

FIG. 10 is a flowchart illustrating an example method 1000 for an example multi-channel memory interface, in accordance with various embodiments. Some or all of the method 1000 may be performed by a multi-channel memory interface coupling a plurality of memory controllers to a memory physical layer (PHY). Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

As illustrated, the method 1000 begins with operation 1002, where a multi-channel memory interface receives a first set of data signals from a first memory controller interface coupled to the multi-channel memory interface (e.g., over a first DFI-based data bus). The method 1000 continues with operation 1004, where the multi-channel memory interface receives a second set of data signal from a second memory controller interface coupled to the multi-channel memory interface (e.g., over a second DFI-based data bus). The method 1000 continues with operation 1006, where the multi-channel memory interface demultiplexes one or more data signals, from the first set of data signals or the second set of data signals, to a physical layer interface (e.g., DFI-based interface with flops) of the multi-channel memory interface, which couples the multi-channel memory interface to a memory physical layer (PHY). The method 1000 continues with operation 1008, where the multi-channel memory interface multiplexes one or more data signals, from the physical layer interface, to at least one of the first memory controller interface or the second memory controller interface.

With respect to memory protocol signal (e.g., DFI memory signal) handling, the method 1000 continues with operation 1010, where the multi-channel memory interface receives a first set of memory protocol signals from the first memory controller interface. The method 1000 continues with operation 1012, where the multi-channel memory interface receives a second set of memory protocol signals from the second memory controller interface. The method 1000 continues with operation 1014, where the multi-channel memory interface generates a third set of memory protocol signals based on (e.g., by logically combining) the first set of memory protocol signals and the second set of memory protocol signals. The method 1000 continues with operation 1016, where the multi-channel memory interface sends (e.g., asserts or deasserts) the third set of memory protocol signals to the physical layer interface.

Figure 11:
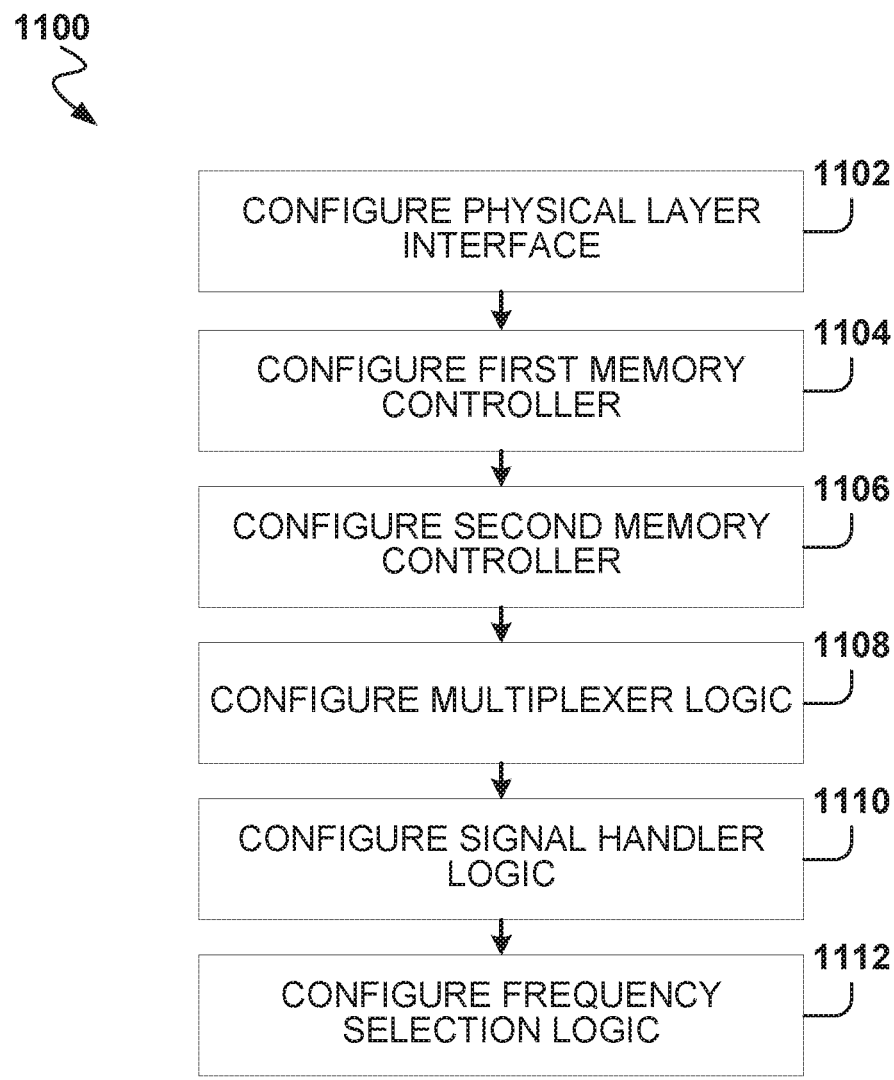
FIG. 11 is a flowchart illustrating an example method for generating a circuit design including an example multi-channel memory interface, in accordance with various embodiments.

FIG. 11 is a flowchart illustrating an example method 1100 for generating a circuit design including an example multi-channel memory interface, in accordance with various embodiments. It will be understood that the method 1100 may be performed by a device, such as a computing device executing instructions of an EDA software system, in accordance with some embodiments. Additionally, the method 1100 herein may be implemented in the form of executable instructions stored on a computer-readable medium or in the form of electronic circuitry. For instance, the operations of the method 1100 may be represented by executable instructions that, when executed by a processor of a computing device, cause the computing device to perform the method 1100. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Referring now to FIG. 11, the method 1100 as illustrated begins with operation 1102, where a physical layer interface (e.g., of a multi-channel memory interface) is configured within a circuit design to couple to a memory physical layer (PHY). The method 1100 continues with operation 1104, where a first memory controller interface (e.g., of a multi-channel memory interface) is configured within the circuit design to couple to a first memory controller that supports a first memory type channel and a second memory type channel. The method 1100 continues with operation 1106, where a second memory controller interface (e.g., of a multi-channel memory interface) is configured within the circuit design to couple to a second memory controller that supports at least the first memory type channel. The method 1100 continues with operation 1108, where multiplexer logic (e.g., of a multi-channel memory interface) is configured within the circuit design to demultiplex one or more data signals from at least one of the first memory controller interface or the second memory controller interface to the physical layer interface, and to multiplex one or more data signals from the physical layer interface to at least one of the first memory controller interface or the second memory controller interface.

The method 1100 continues with operation 1110, where signal handler logic (e.g., of a multi-channel memory interface) is configured within the circuit design to: receive a first set of memory protocol signals from the first memory controller; receive a second set of memory protocol signals from the second memory controller; generate a third set of memory protocol signals based on the first set of memory protocol signals and the second set of memory protocol signals; and provide the third set of memory protocol signals for transmission to the memory physical layer through the physical layer interface. At operation 1110, the signal handler logic may be further configured to: receive through the physical layer interface a fourth set of memory protocol signals from the memory physical layer, and selectively pass the fourth set of memory protocol signals to at least one of the first memory controller through the first memory controller interface or the second memory controller through the second memory controller interface.

The method 1100 continues with operation 1112, where frequency selection logic (e.g., of a multi-channel memory interface) is configured within the circuit design to: detect for a request to a request to initialize a data frequency selection event from each of the first memory controller and the second memory controller; and in response to detecting the request to initialize the data frequency selection event from each of the first memory controller and the second memory controller, send a data frequency selection command to the memory physical layer.

Figure 12:
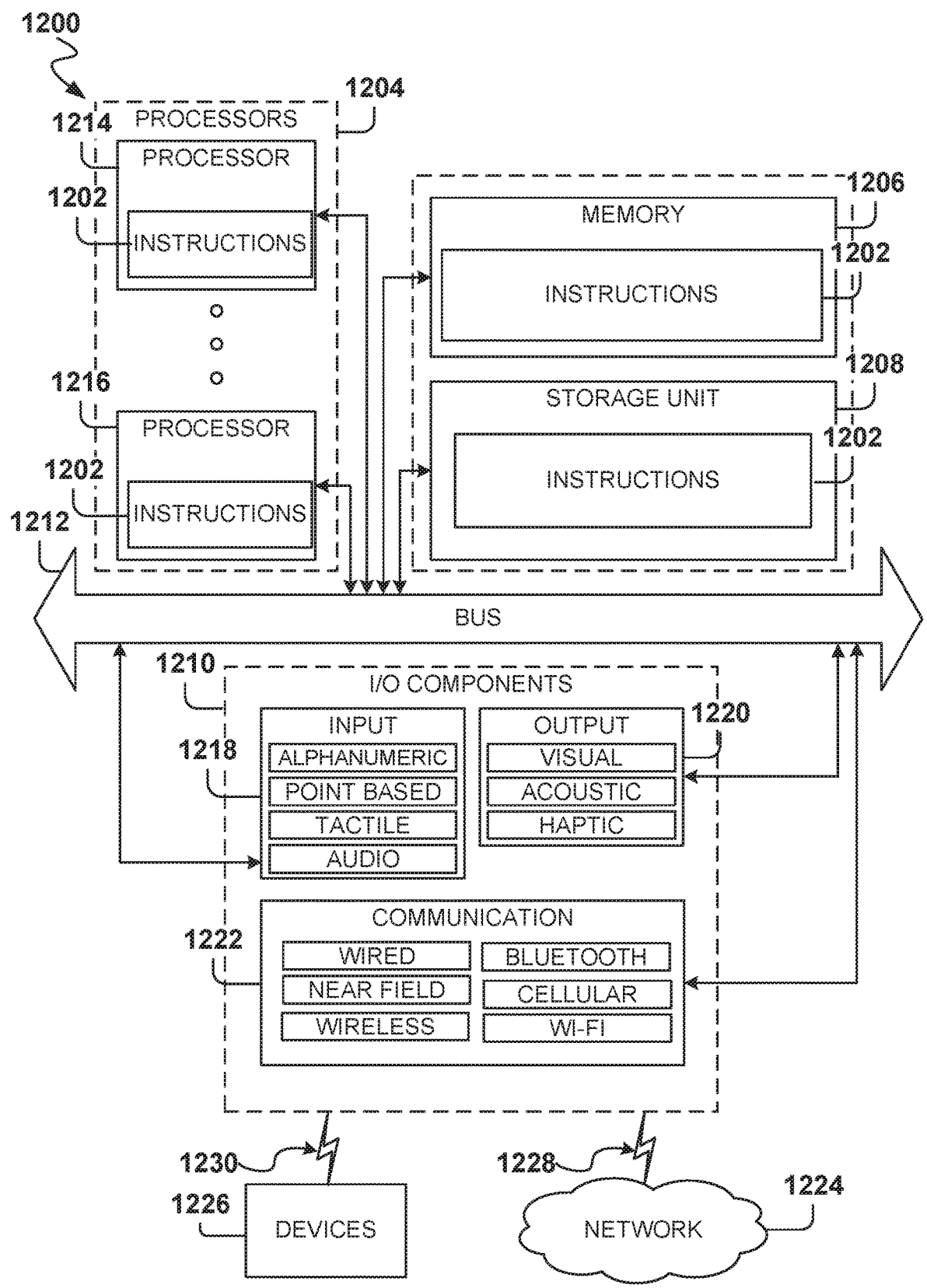
FIG. 12 is a block diagram illustrating components of a machine, according to some example embodiments, able to read instructions from a machine-readable medium and perform any one or more of the methodologies discussed herein.

FIG. 12 is a block diagram illustrating components of a machine 1200, according to some example embodiments, able to read instructions from a machine-readable medium (e.g., a machine-readable storage medium) and perform any one or more of the methodologies discussed herein. Specifically, FIG. 12 shows a diagrammatic representation of the machine 1200 in the example form of a system, within which instructions 1202 (e.g., software, a program, an application, an applet, an app, a driver, or other executable code) for causing the machine 1200 to perform any one or more of the methodologies discussed herein may be executed. For example, the instructions 1202 include executable code that causes the machine 1200 to execute the method 1100. In this way, these instructions 1202 transform the general, non-programmed machine 1200 into a particular machine programmed to carry out the described and illustrated method 1100 in the manner described herein. The machine 1200 may operate as a standalone device or may be coupled (e.g., networked) to other machines.

By way of non-limiting example, the machine 1200 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 1202, sequentially or otherwise, that specify actions to be taken by the machine 1200. Further, while only a single machine 1200 is illustrated, the term "machine" shall also be taken to include a collection of machines 1200 that individually or jointly execute the instructions 1202 to perform any one or more of the methodologies discussed herein.

The machine 1200 may include processors 1204, memory 1206, a storage unit 1208, and I/O components 1210, which may be configured to communicate with each other such as via a bus 1212. In an example embodiment, the processors 1204 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 1214 and a processor 1216 that may execute the instructions 1202. The term "processor" is intended to include multi-core processors 1204 that may comprise two or more independent processors (sometimes referred to as "cores") that may execute instructions 1202 contemporaneously. Although FIG. 12 shows multiple processors 1204, the machine 1200 may include a single processor with a single core, a single processor with multiple cores (e.g., a multi-core processor), multiple processors with a single core, multiple processors with multiple cores, or any combination thereof.

The memory 1206 (e.g., a main memory or other memory storage) and the storage unit 1208 are both accessible to the processors 1204 such as via the bus 1212. The memory 1206 and the storage unit 1208 store the instructions 1202 embodying any one or more of the methodologies or functions described herein. The instructions 1202 may also reside, completely or partially, within the memory 1206, within the storage unit 1208, within at least one of the processors 1204 (e.g., within the processor's cache memory), or any suitable combination thereof, during execution thereof by the machine 1200. Accordingly, the memory 1206, the storage unit 1208, and the memory of the processors 1204 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 1202. The term "machine-readable medium" shall also be taken to include any medium, or combination of multiple media, that is capable of storing instructions (e.g., instructions 1202) for execution by a machine (e.g., machine 1200), such that the instructions, when executed by one or more processors of the machine (e.g., processors 1204), cause the machine to perform any one or more of the methodologies described herein (e.g., method 1100). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 1210 may include a wide variety of components to receive input, provide output, produce output, transmit information, exchange information, capture measurements, and so on. The specific I/O components 1210 that are included in a particular machine 1200 will depend on the type of the machine 1200. For example, portable machines such as mobile phones will likely include a touch input device or other such input mechanisms, while a headless server machine will likely not include such a touch input device. It will be appreciated that the I/O components 1210 may include many other components that are not specifically shown in FIG. 12. The I/O components 1210 are grouped according to functionality merely for simplifying the following discussion and the grouping is in no way limiting. In various example embodiments, the I/O components 1210 may include input components 1218 and output components 1220. The input components 1218 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 1220 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 1210 may include communication components 1222 operable to couple the machine 1200 to a network 1224 or devices 1226 via a coupling 1228 and a coupling 1230 respectively. For example, the communication components 1222 may include a network interface component or another suitable device to interface with the network 1224. In further examples, the communication components 1222 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 1226 may be another machine or any of a wide variety of peripheral devices.

MODULES, COMPONENTS AND LOGIC

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 13:
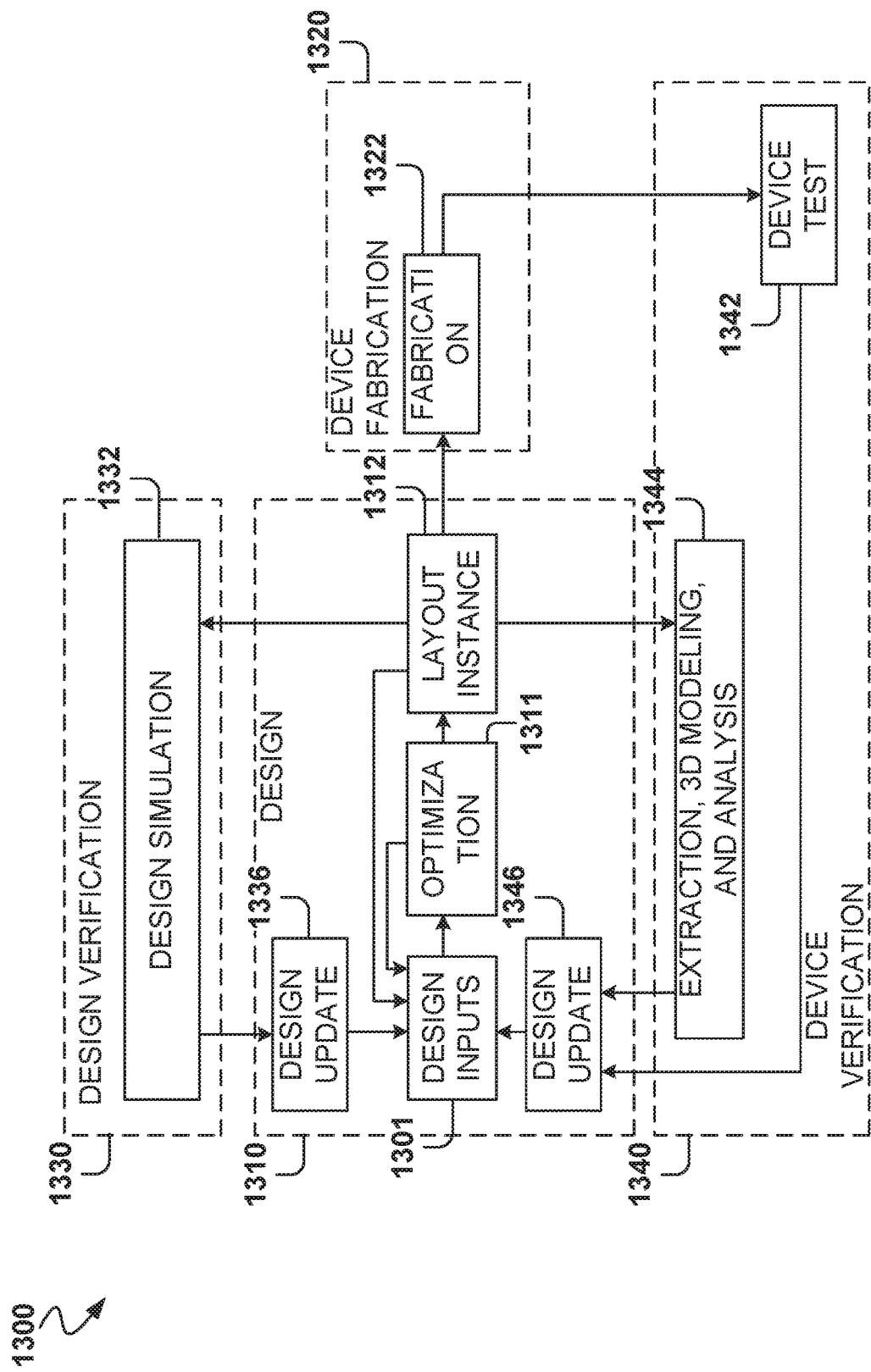
FIG. 13 is a diagram illustrating one possible design process flow for generating a circuit, including embodiments to implement a multi-channel memory interface as described herein, and in various embodiments, to integrate the multi-channel memory interface with a larger integrated circuit comprising different design blocks.

FIG. 13 is a diagram illustrating one possible design process flow for generating a circuit, including embodiments to implement a multi-channel memory interface as described herein, and in various embodiments, to integrate the multi-channel memory interface with a larger integrated circuit comprising different design blocks. As illustrated, the overall design flow 1300 includes a design phase 1310, a device fabrication phase 1320, a design verification phase 1330, and a device verification phase 1340. The design phase 1310 involves an initial design input operation 1301 where the basic elements and functionality of a device are determined, as well as revisions based on various analyses and optimization of a circuit design. This design input operation 1301 is where instances of an EDA circuit design file are used in the design and any additional circuitry is selected. The initial strategy, tactics, and context for the device to be created are also generated in the design input operation 1301, depending on the particular design algorithm to be used.

In some embodiments, following an initial selection of design values in the design input operation 1301, timing analysis and optimization according to various embodiments occurs in an optimization operation 1311, along with any other automated design processes. One such process may be the automated design of a partitioned root search for error locator polynomial functions in RS FEC decoding. As described below, design constraints for blocks of a circuit design generated with design inputs in the design input operation 1301 may be analyzed using hierarchical timing analysis, according to various embodiments. While the design flow 1300 shows such optimization occurring prior to a layout instance 1312, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1322.

After design inputs are used in the design input operation 1301 to generate a circuit layout, and any optimization operations 1311 are performed, a layout is generated in the layout instance 1312. The layout describes the physical layout dimensions of the device that match the design inputs. This layout may then be used in the device fabrication operation 1322 to generate a device, or additional testing and design updates may be performed using designer inputs or automated updates based on design simulation 1332 operations or extraction, 3D modeling, and analysis 1344 operations. Once the device is generated, the device can be tested as part of device test 1342 operations, and layout modifications generated based on actual device performance.

As described in more detail below, design updates 1336 from the design simulation 1332, design updates 1346 from the device test 1342, the 3D modeling and analysis 1344 operations, or the design input operation 1301 may occur after an initial layout instance 1312 is generated. In various embodiments, whenever design inputs are used to update or change an aspect of a circuit design, a timing analysis and optimization operation 1311 may be performed.

For example, in various embodiments, a user may provide an input to a computing device indicating placement of elements of a circuit within a first portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
    a physical layer interface to couple to a memory physical layer;
    a first memory controller interface to couple to a first memory controller that supports a first memory type channel, a second memory type channel, and a first maximum data width;
    a second memory controller interface to couple to a second memory controller that supports at least the first memory type channel, and supports a second maximum data width that is less than or equal to the first maximum data width;
    multiplexer logic to demultiplex one or more data signals from at least one of the first memory controller interface or the second memory controller interface to the physical layer interface, and to multiplex one or more data signals from the physical layer interface to at least one of the first memory controller interface or the second memory controller interface; and
    signal handler logic to receive a first set of memory protocol signals from the first memory controller, receive a second set of memory protocol signals from the second memory controller, generate a third set of memory protocol signals based on the first set of memory protocol signals and the second set of memory protocol signals, and provide the third set of memory protocol signals for transmission to the memory physical layer through the physical layer interface.

2. The circuit of claim 1, wherein the signal handler logic generates the third set of memory protocol signals based on the first set of memory protocol signals and the second set of memory protocol signals by at least one of:
    logically OR a first reset signal from the first set of memory protocol signals and a second reset signal from the second set of memory protocol signals to generate a reset signal in the third set of memory protocol signals; or
    multiplexing the first reset signal and the second reset signal, based on whether one of the first memory controller and the second memory controller is set as a master memory controller, to generate the reset signal in the third set of memory protocol signals.

3. The circuit of claim 1, wherein the signal handler logic generates the third set of memory protocol signals based on the first set of memory protocol signals and the second set of memory protocol signals such that:
    each of the first memory controller and the second memory controller has an independent programming path to the memory physical layer through the physical layer interface; and
    one of the first memory controller and the second memory controller is set as a memory master controller.

4. The circuit of claim 1, wherein the signal handler logic generates the third set of memory protocol signals based on the first set of memory protocol signals and the second set of memory protocol signals by:
    determining whether the first memory controller is asserting an initialization start signal in the first set of memory protocol signals and the second memory controller is asserting the initialization start signal in the second set of memory protocol signals; and
    asserting the initialization start signal in the third set of memory protocol signals based on determining that both the first memory controller is asserting the initialization start signal in the first set of memory protocol signals and the second memory controller is asserting the initialization start signal in the second set of memory protocol signals.

5. The circuit of claim 1, wherein the signal handler logic generates the third set of memory protocol signals based on the first set of memory protocol signals and the second set of memory protocol signals by:
    determining whether the first memory controller is asserting a clock disable signal in the first set of memory protocol signals and the second memory controller is asserting the clock disable signal in the second set of memory protocol signals; and
    asserting the initialization start signal in the third set of memory protocol signals based on determining that both the first memory controller is asserting the clock disable signal in the first set of memory protocol signals and the second memory controller is asserting the clock disable signal in the second set of memory protocol signals.

6. The circuit of claim 1, wherein the signal handler logic is to further receive through the physical layer interface a fourth set of memory protocol signals from the memory physical layer, and selectively pass the fourth set of memory protocol signals to at least one of the first memory controller through the first memory controller interface or the second memory controller through the second memory controller interface.

7. The circuit of claim 6, wherein the signal handler logic selectively passes the fourth set of memory protocol signals to at least one of the first memory controller or the second memory controller by passing an initialization complete signal, included in the fourth set of memory protocol signals, to both the first memory controller and the second memory controller.

8. The circuit of claim 6, wherein the signal handler logic selectively passes the fourth set of memory protocol signals to at least one of the first memory controller or the second memory controller by passing a request, included in the fourth set of memory protocol signals, to both the first memory controller and the second memory controller, and wherein the signal handler logic generates the third set of memory protocol signals based on the first set of memory protocol signals and the second set of memory protocol signals by:
  detecting for an acknowledgement to the request from each of the first memory controller and the second memory controller; and
  in response to detecting the acknowledgement from each of the first memory controller and the second memory controller, passing the acknowledgement to the memory physical layer through the physical layer interface.

9. The circuit of claim 8, wherein the request comprises at least one of a physical layer master request or a physical layer update request.

10. The circuit of claim 6, wherein the signal handler logic selectively passes the fourth set of memory protocol signals to at least one of the first memory controller or the second memory controller by passing a bus error signal, included in the fourth set of memory protocol signals, to both the first memory controller and the second memory controller.

11. The circuit of claim 1, further comprising data frequency selection logic to:
  assert a hardware interface request to both the first memory controller and the second memory controller;
  detect for an acknowledgement to the hardware interface request from each of the first memory controller and the second memory controller; and
  in response to detecting the acknowledgement from each of the first memory controller and the second memory controller, send a data frequency selection command to both the first memory controller and the second memory controller.

12. The circuit of claim 1, further comprising the first memory controller and the second memory controller.

13. The circuit of claim 12, wherein each of the first memory controller and the second memory controller comprises oscillator logic to:
  detect receipt of a request from the memory physical layer through the physical layer interface; and
  in response to detecting receipt of the request:
  determine whether an oscillator-related function is in progress with respect to a memory channel associated with the memory physical layer; and
  in response to determining that the oscillator-related function is in progress:
  detect when the oscillator-related function is no longer in progress; and
  in response to detecting that the oscillator-related function is no longer in progress, send an acknowledgment of the request to the memory physical layer through the physical layer interface.

14. The circuit of claim 1, wherein the first memory type channel comprises a memory channel for double data rate fifth-generation (DDR5) and the second memory type channel comprises a memory channel for double data rate fourth-generation (DDR4).

15. The circuit of claim 1, wherein the physical layer interface comprises a DDR PHY Interface (DFI) with flops.

16. The circuit of claim 1, wherein at least one of the first memory controller or the second memory controller comprises a DDR PHY Interface (DFI) with no flops.

17. A method comprising:
  receiving, at a first memory controller interface of a memory channel interface, a first set of data signals from a first memory controller coupled to the first memory controller interface, the first memory controller supporting a first memory type channel, a second memory type channel, and a first maximum data width;
  receiving, at a second memory controller interface of the memory channel interface, a second set of data signals from a second memory controller coupled to the second memory controller interface, the second memory controller supporting at least the first memory type channel and supporting a second maximum data width that is less than or equal to than the first maximum data width;
  demultiplexing, by the memory channel interface, one or more data signals from the first set of data signals or the second set of data signals to a physical layer interface of the memory channel interface, the physical layer interface being coupled to a memory physical layer;
  multiplexing, by the memory channel interface, one or more data signals from the physical layer interface to at least one of the first memory controller interface or the second memory controller interface;
  receiving, by the memory channel interface, a first set of memory protocol signals from the first memory controller interface;
  receiving, by the memory channel interface, a second set of memory protocol signals from the second memory controller interface;
  generating, by the memory channel interface, a third set of memory protocol signals based on the first set of memory protocol signals and the second set of memory protocol signals; and
  sending, by the memory channel interface, the third set of memory protocol signals to the physical layer interface.

* * * * *